(12) United States Patent
He et al.

(10) Patent No.: US 12,177,966 B2
(45) Date of Patent: Dec. 24, 2024

(54) LIGHT BOARD, METHOD FOR MANUFACTURING THE SAME, AND LED BACKLIGHT MODULE AND LED BACKLIGHT DEVICE

(71) Applicant: FOSHAN NATIONSTAR OPTOELECTRONICS CO., LTD., Foshan (CN)

(72) Inventors: Xinghan He, Foshan (CN); Danlei Gong, Foshan (CN); Zhonghai Yan, Foshan (GD); Hua Fan, Foshan (CN); Fabo Liu, Foshan (CN); Youwei Zhan, Foshan (CN); Weineng Chen, Foshan (CN); Taotao Song, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 0 days.

(21) Appl. No.: 18/091,539

(22) Filed: Dec. 30, 2022

(65) Prior Publication Data
US 2023/0217586 A1 Jul. 6, 2023

(30) Foreign Application Priority Data
Dec. 31, 2021 (CN) .......................... 202111673546.X

(51) Int. Cl.
*H05K 1/02* (2006.01)
*F21V 19/00* (2006.01)
(Continued)

(52) U.S. Cl.
CPC ....... *H05K 1/0271* (2013.01); *F21V 19/0025* (2013.01); *F21V 29/70* (2015.01);
(Continued)

(58) Field of Classification Search
CPC .... H05K 1/0271; H05K 1/0203; H05K 3/306; H05K 3/4038; H05K 2201/10106;
(Continued)

(56) References Cited

U.S. PATENT DOCUMENTS

2014/0251658 A1* 9/2014 Lin ...................... H05K 1/0271
174/252

FOREIGN PATENT DOCUMENTS

CN 203982701 U 12/2014
CN 207235211 U 4/2018
(Continued)

OTHER PUBLICATIONS

Office Action received in Chinese Application No. 202111673546.X dated Sep. 8, 2023, with translation, 10 pages.

*Primary Examiner* — Elmito Breval
(74) *Attorney, Agent, or Firm* — CM Law; Stephen J. Weed

(57) ABSTRACT

Provided are a light board, a method for manufacturing the same, a light-emitting diode (LED) backlight module and an LED backlight device. The light board includes a substrate and a LED device. The substrate includes a first surface and a second surface disposed opposite to each other. The first surface and the second surface are each provided with a wiring area and a non-wiring area. A first heat sink assembly and multiple first reinforcement ribs are disposed in the non-wiring area of the first surface. The multiple first reinforcement ribs intersect to form a first encircled area. The first heat sink assembly is disposed in the first encircled area. The LED device is disposed in the wiring area of the second surface.

16 Claims, 5 Drawing Sheets

(51) Int. Cl.
- *F21V 29/70* (2015.01)
- *H05K 3/30* (2006.01)
- *H05K 3/40* (2006.01)
- *F21Y 105/10* (2016.01)
- *F21Y 115/10* (2016.01)

(52) U.S. Cl.
CPC .......... *H05K 1/0203* (2013.01); *H05K 3/306* (2013.01); *H05K 3/4038* (2013.01); *F21Y 2105/10* (2016.08); *F21Y 2115/10* (2016.08); *H05K 2201/10106* (2013.01)

(58) Field of Classification Search
CPC .. H05K 1/181; H05K 1/0209; F21V 19/0025; F21V 29/70; F21Y 2105/10; F21Y 2115/10; F21K 9/90; F21K 9/00
See application file for complete search history.

(56) References Cited

FOREIGN PATENT DOCUMENTS

| | | | |
|---|---|---|---|
| CN | 209026562 U | 6/2019 | |
| CN | 112285974 A | 1/2021 | |
| JP | 2010129359 A | 6/2010 | |
| TW | 201507556 A | * 2/2015 | ......... H01L 23/3677 |

* cited by examiner

LIGHT BOARD, METHOD FOR MANUFACTURING THE SAME, AND LED BACKLIGHT MODULE AND LED BACKLIGHT DEVICE

CROSS-REFERENCE TO RELATED APPLICATION

This application claims priority to Chinese Patent Application No. 202111673546.X filed Dec. 31, 2021, the disclosure of which is incorporated herein by reference in its entirety.

TECHNICAL FIELD

The present disclosure relates to the field of backlight devices and, in particular, to a light board, a method for manufacturing the same, a light-emitting diode (LED) backlight module including the light board, and an LED backlight device including the LED backlight module.

BACKGROUND

Nowadays, with people's standard of living raises, the requirement for image quality of displays such as a television is getting higher and higher, so the quality requirement for flatness of a backlight light board used in the displays such as the television is also getting higher and higher. Due to the restriction of the current production process and technology, it is difficult to integrate the backlight light board. Therefore, it is necessary to divide the whole backlight light board into several spliced light board modules. If there is an excessive number of light board modules, the production cost will be seriously affected and the production efficiency will be greatly reduced. Therefore, considering the economy and production technology, it is necessary to increase the size of the light board in the light board module as much as possible, and the size of the short side of the light board is great than or equal to 200 mm. However, when the large-sized light board is produced and mounted, the light board may be warped and deformed seriously due to the thermal stress concentration. The warpage affects the assembly and light-emitting effect of the light board, so the warping problem restricts the size of the light board and limits the production scale.

The requirement for high image quality of the displays causes light-emitting diodes (LEDs) to be large in number and dense in the light board module. Therefore, at present, it is necessary to use a FR4 circuit board (FR4, epoxy glass cloth laminate) to meet the complex circuit traces. The FR4 and the copper foil have different shrinkage deformation rates, the larger the size of the light board, the larger the warpage of the light board when the light board passes through the reflow oven. The warpage deformation of the light board may be as high as 7 mm to 12 mm, thereby seriously affecting the appearance and product performance.

At present, the conventional method to ameliorate the warpage problem is to open larger holes on the circuit board so that the stress of the light board can be effectively released when the light board passes through the reflow oven. However, for the display such as the television having a high requirement for image quality and chroma, due to dense arrangement of the LEDs, there is no redundant space on the light board, and thus it is difficult to ameliorate the warpage problem of the light board by opening holes.

SUMMARY

The present disclosure provides a light board. The light board has a large size and a flat surface.

The present disclosure provides a method for manufacturing a light board. The method has high production efficiency and low production cost.

The present disclosure provides a light-emitting diode (LED) backlight module. The LED backlight module has a large size and a good display effect.

The present disclosure provides a light-emitting diode (LED) backlight device. The LED backlight device has a good image quality and a low production cost.

To achieve the preceding objects, the present disclosure adopts the technical solutions below.

In a first aspect, a light board is provided. The light board includes a substrate and a light-emitting diode (LED) device.

The substrate includes a first surface and a second surface disposed opposite to each other. The first surface and the second surface are each provided with a wiring area and a non-wiring area. A first heat sink assembly and multiple first reinforcement ribs are disposed in the non-wiring area of the first surface. The multiple first reinforcement ribs intersect to form a first encircled area. The first heat sink assembly is disposed in the first encircled area.

The LED device is disposed in the wiring area of the second surface.

In an embodiment, each of the first surface and the second surface is provided with an insulating layer.

In an embodiment, the first heat sink assembly has a mesh structure.

In an embodiment, a first reinforcement assembly is disposed at an intersection of at least two intersecting first reinforcement ribs, and the first reinforcement assembly covers the intersection of the first reinforcement ribs.

In an embodiment, a second heat sink assembly is disposed in the non-wiring area of the second surface.

In an embodiment, multiple second reinforcement ribs is disposed in the non-wiring area of the second surface; the multiple second reinforcement ribs intersect to form a second encircled area; and the second heat sink assembly is disposed in the second encircled area.

In an embodiment, the non-wiring area of the substrate is provided with multiple through holes, and a hole wall of each of the multiple through holes is provided with a first metal layer.

In an embodiment, the multiple first reinforcement ribs, the multiple second reinforcement ribs, the first heat sink assembly and the second heat sink assembly are each made of metal, and first metal layers of any two of the multiple through holes are connected to a first reinforcement rib or a second reinforcement rib between the any two of the multiple through holes to form a semi-closed loop.

In an embodiment, the multiple first reinforcement ribs, the multiple second reinforcement ribs, the first heat sink assembly and the second heat sink assembly are made of metal, and first metal layers of any two of the multiple through holes are connected to a first reinforcement rib and a second reinforcement rib between the any two of the multiple through holes to form a closed loop.

In a second aspect, a method for manufacturing a light board is provided to manufacture the preceding light board. The method includes the steps below.

In step S10, a substrate is provided and a second metal layer is disposed on each of a first surface and a second surface of the substrate.

In step S20, the second metal layer is etched to form multiple first reinforcement ribs, a first heat sink assembly, a second heat sink assembly and a circuit structure in a wiring area.

In step S30, a light-emitting diode (LED) device is provided and the LED device is connected to the circuit structure in the wiring area of the second surface.

In a preferred solution of the preparation method, the step S20 includes the step below.

The second metal layer on the second surface is etched to form multiple second reinforcement ribs on the second surface.

In a preferred solution of the preparation method, before the step S20, the method includes the step below.

In S101, multiple through holes are formed on the substrate, and a hole wall of each through hole is provided with a first metal layer to enable the first metal layer to be connected to a second metal layer on at least one of the first surface or the second surface so as to form a semi-closed loop or a closed loop.

In a third aspect, a light-emitting diode (LED) backlight module is provided. The LED backlight module includes the preceding light board.

In a fourth aspect, a light-emitting diode (LED) backlight device is provided. The LED backlight device includes the preceding LED backlight module.

BRIEF DESCRIPTION OF DRAWINGS

The present disclosure will be further described in detail according to the drawings and embodiments.

Figure 1:
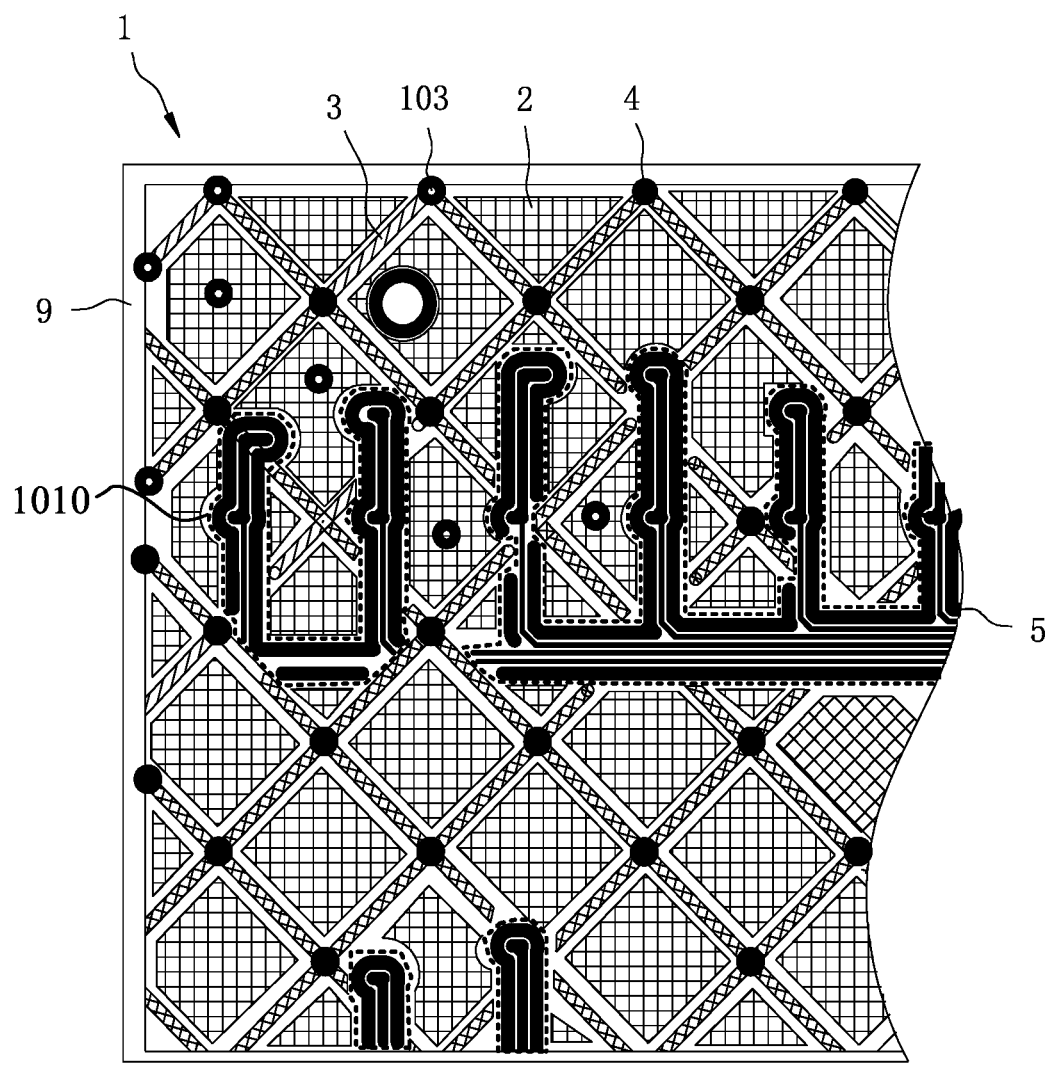
FIG. 1 is a schematic view of a first surface of a light board according to an embodiment of the present disclosure.

REFERENCE LIST 1 substrate
101 first surface
1010 wiring area
102 second surface
103 through hole
2 first heat sink assembly
3 first reinforcement rib
4 first reinforcement assembly
5 circuit structure
501 pad
502 LED device
6 insulating layer
7 first metal layer
8 second reinforcement rib
9 first frame
10 second frame
11 second heat sink assembly
12 second reinforcement assembly

DETAILED DESCRIPTION

To make solved problems, adopted solutions and achieved effects of the present disclosure more apparent, the solutions of the present disclosure are further described in conjunction with the drawings and embodiments. The embodiments described below are part, not all, of embodiments of the present disclosure. Based on the embodiments of the present disclosure, all other embodiments Based on the embodiments of the present disclosure, all other embodiments acquired by those skilled in the art are within the scope of the present disclosure on the premise that no creative work is done.

In the description of the present disclosure, unless otherwise expressly specified and limited, the term "connected to each other", "connected" or "secured" is to be construed in a broad sense, for example, as securely connected, detachably connected or integrated; mechanically connected or electrically connected; directly connected to each other or indirectly connected to each other via an intermediary; or internally connected between two components or interaction relations between two components. For those of ordinary skill in the art, specific meanings of the preceding terms in the present disclosure may be understood based on specific situations.

As shown in FIGS. 1 to 3, and 6, the present disclosure provides a light board. The light board includes a substrate 1 and a light-emitting diode (LED) device 502. The substrate 1 includes a first surface 101 and a second surface 102 disposed opposite to each other. The first surface 101 and the second surface 102 are each provided with a wiring area 1010 and a non-wiring area. The non-wiring area is an area of the first surface 101 or the second surface 102 other than the wiring area 1010. In the present embodiment, the first surface 101 of the substrate 1 is a back surface and the second surface 102 of the substrate 1 is a front surface. A first heat sink assembly 2 and multiple first reinforcement ribs 3 are disposed in the non-wiring area of the first surface 101. The multiple first reinforcement ribs 3 intersect to form a first encircled area. The first heat sink assembly 2 is disposed in the first encircled area. In the present embodiment, the LED device 502 is disposed in the wiring area 1010 of the second surface 102. The multiple first reinforcement ribs 3 are provided to support the substrate 1. The multiple first reinforcement ribs 3 intersect to form the first encircled area, facilitating enhancing the stability of the structure of the first reinforcement ribs 3 and reducing the deformation of the substrate 1 generated in the hot working process. The first heat sink assembly 2 is provided to enhance the heat dissipation effect of the first surface 101 and reduce the heat accumulation on the substrate 1.

Specifically, the first heat sink assembly 2 has a mesh structure. The first heat sink assembly 2 is configured to be the mesh structure so that the heat dissipation area of the substrate 1 can be increased. It can be understood that the first heat sink assembly 2 is provided with multiple meshes, and in the present embodiment, a side surface of the first heat sink assembly 2 farther from the substrate 1 and the hole walls of the meshes of the first heat sink assembly 2 can all be used as a heat dissipation surface of the light board. During processing of the light board, the first heat sink assembly 2 can dissipate heat on the substrate 1 to reduce the heat accumulation on the substrate 1, thereby reducing the thermal stress of the substrate 1 and reducing the deformation of the substrate 1 generated in the hot working process. Since the substrate 1 has smaller deformation, the size of the substrate 1 can be appropriately increased.

In the present embodiment, each first reinforcement rib 3 is disposed at an included angle with respect to an edge of the substrate 1. The first reinforcement rib 3 is disposed at the included angle with respect to the edge of the substrate 1, thereby enhancing the strength of the edge of the substrate 1, reducing the deformation of the edge of the substrate 1, reducing the probability of bending and warpage of the substrate 1 in the hot working process, and facilitating increasing the size of the light board.

In the present embodiment, the first surface 101 of the substrate 1 is provided with a first frame 9, the first reinforcement ribs 3 are disposed in the first frame 9, and ends of the first reinforcement ribs 3 are connected to the first frame 9. Referring to FIG. 1, in the present embodiment, the first reinforcement rib 3 is disposed at the included angle with respect to the first frame 9, and a triangle structure is formed by the first reinforcement ribs 3 and the first frame 9. It can be understood that the triangle structure has high stability and is not easy to deform. Therefore, the first frame 9 can enhance the structural stability of the first reinforcement ribs 3, reduce the deformation of the ends of the first reinforcement ribs 3, thereby reducing the deformation of the substrate 1.

Figure 4:
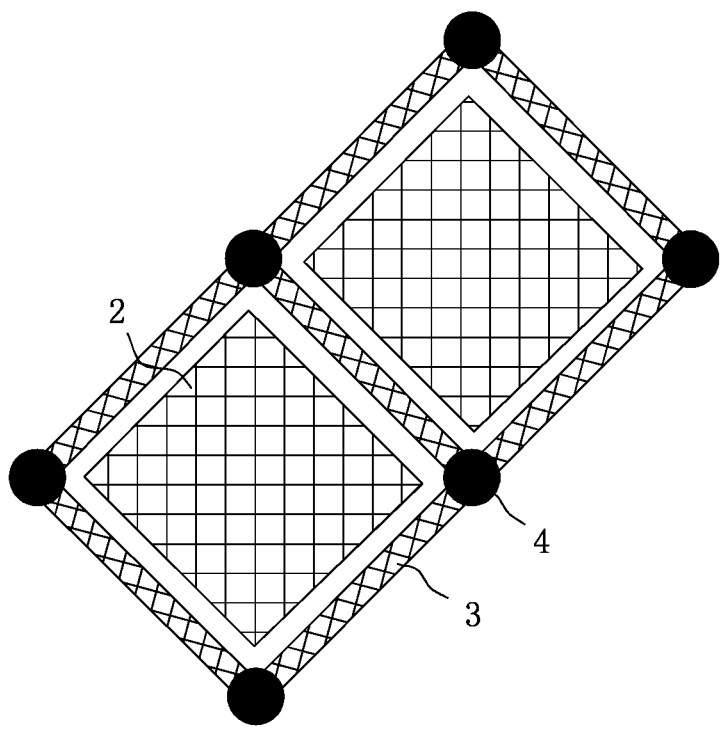
FIG. 4 is a schematic view illustrating shapes of a first reinforcement rib and a first heat sink assembly according to an embodiment of the present disclosure.

Referring to FIGS. 1 and 4, preferably, the first reinforcement rib 3 is disposed at 45° with respect to the edge of the substrate 1. In this case, the included angle between the first reinforcement rib 3 and the first frame is also 45°. In the present embodiment, the substrate 1 is a rectangle so that any two intersecting first reinforcement ribs 3 are perpendicular to each other, facilitating further improving the stability of the structure of the first reinforcement ribs 3.

Figure 5:
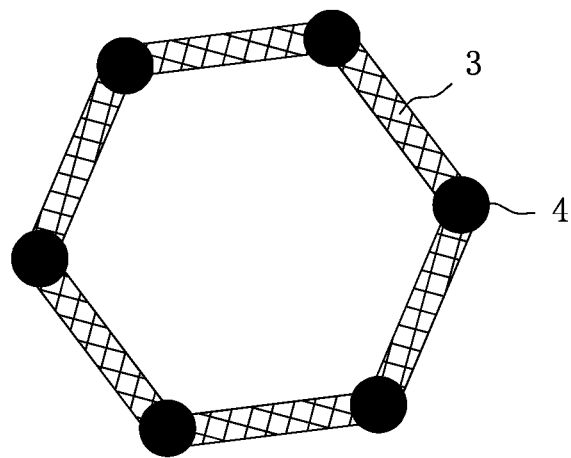
FIG. 5 is a schematic view illustrating a shape of a first reinforcement rib according to another embodiment of the present disclosure.

Specifically, multiple first reinforcement ribs 3 intersect to form the first encircled area, and the shape of the first encircled area is a polygon. In the present embodiment, the first encircled area formed by the intersecting first reinforcement ribs 3 is rectangular, and the shape of the first heat sink assembly 2 is adapted to the shape of the first encircled area. Referring to FIG. 5, in another embodiment, the first encircled area formed by the intersecting first reinforcement ribs 3 is hexagonal. The shape of the first encircled area may be designed according to the shape, length-width ratio and stress characteristic of the light board. In other embodiments, the first encircled area may also be in another polygonal shape such as a pentagon or a heptagon.

Specifically, a first reinforcement assembly 4 is disposed at an intersection of at least two intersecting first reinforcement ribs 3. The first reinforcement assembly 4 is provided so that the connection strength between the two intersecting first reinforcement ribs 3 can be enhanced to reduce the deformation amount of the first reinforcement rib 3, thereby reducing the warpage deformation of the substrate 1 during the hot working process.

Specifically, the first reinforcement assembly 4 covers the intersection of the first reinforcement ribs 3. That is, the size of the first reinforcement assembly 4 is larger than or equal to a diagonal width of the intersection of the first reinforcement ribs 3. In the present embodiment, a projection of the first reinforcement assembly 4 on the substrate is circular, and the diameter of the projection of the first reinforcement assembly 4 on the substrate 1 is larger than or equal to the diagonal width of the intersection of the first reinforcement ribs 3. In present embodiment, multiple first reinforcement ribs 3 on the same surface are integrally formed. For example, the intersecting first reinforcement ribs 3 may be formed by stamping a copper plate. In this case, the first reinforcement assembly 4 is disposed at the intersection of the first reinforcement ribs 3 so that the connection strength of the first reinforcement ribs 3 can be enhanced, thereby improving the anti-deformation ability of the light board.

Figure 3:
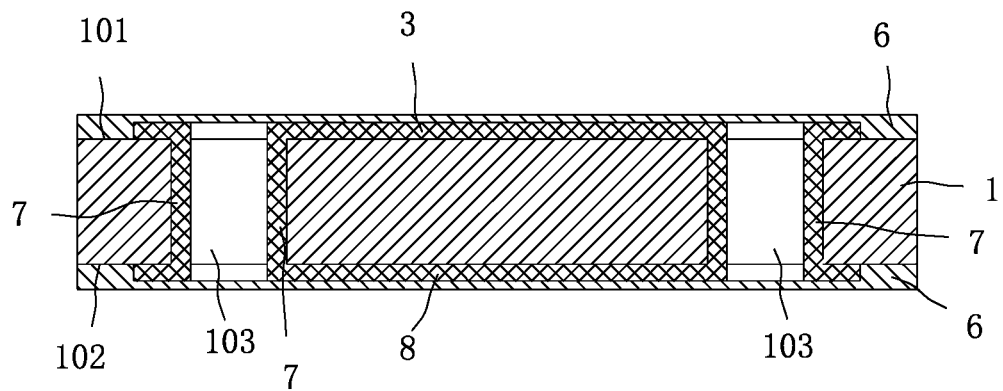
FIG. 3 is a sectional view of a light board according to another embodiment of the present disclosure.
Figure 6:
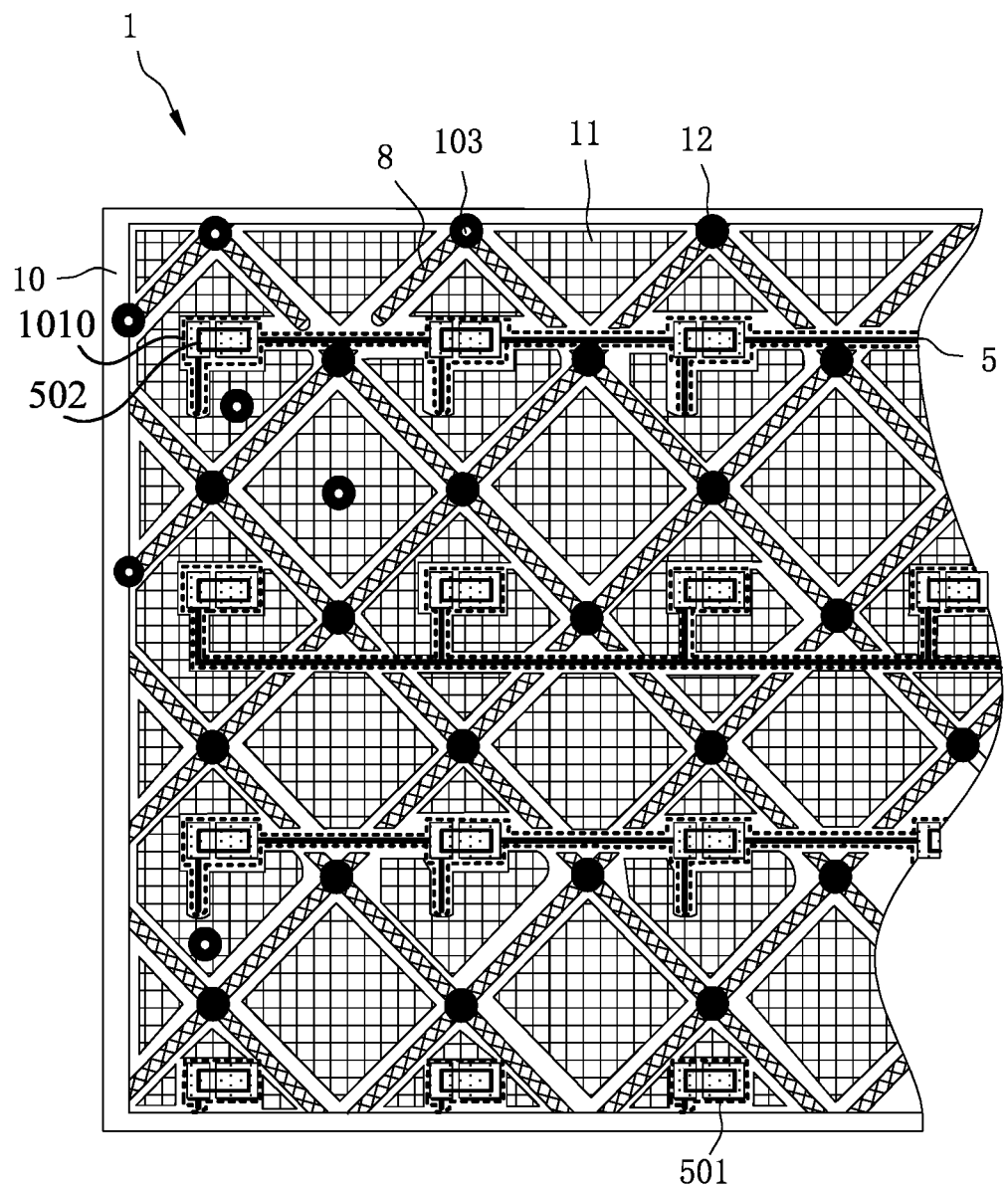
FIG. 6 is a schematic view of a second surface of a light board according to an embodiment of the present disclosure.

Referring to FIGS. 3 and 6, in an embodiment, a second heat sink assembly 11 is disposed in the non-wiring area of the second surface 102. The second heat sink assembly 11 is disposed on the second surface 102 of the substrate 1 so that the heat dissipation area of the substrate 1 can be increased, and the heat dissipation effect on the substrate 1 can be improved, thereby reducing the deformation of the substrate 1 during the hot working process.

Specifically, the second heat sink assembly 11 has a mesh structure. The second heat sink assembly 11 is configured to be the mesh structure so that the heat dissipation area of the substrate 1 can be increased. It can be understood that the second heat sink assembly 11 is provided with multiple meshes, and in this embodiment, a side surface of the second heat sink assembly 11 farther from the substrate 1 and the hole walls of the meshes of the second heat sink assembly 11 can all be used as the heat dissipation surface of the light board. During the light board processing, the second heat sink assembly 11 can dissipate heat on the substrate 1 to reduce the heat accumulation on the substrate 1, thereby reducing the thermal stress of the substrate 1 and reducing the deformation of the substrate 1 generated in the heating process. Since the substrate 1 has smaller deformation, the size of the substrate 1 can be appropriately increased.

Specifically, multiple second reinforcement ribs 8 are disposed in the non-wiring area of the second surface 102. The multiple second reinforcement ribs 8 intersect to form a second encircled area. The second heat sink assembly 11 is disposed in the second encircled area. In this case, the first reinforcement ribs 3 and the second reinforcement ribs 8 can both reinforce the substrate 1, further reducing the warpage deformation of the substrate 1.

In the present embodiment, an included angle is disposed between each second reinforcement rib 8 and the edge of the substrate 1. Preferably, the second reinforcement rib 8 is disposed at 45° with respect to the edge of the substrate 1. Any two intersecting second reinforcement ribs 8 are perpendicular to each other. A second reinforcement assembly 12 is disposed at an intersection of at least two intersecting second reinforcement ribs 8. The size of the second reinforcement assembly 12 is larger than the width of the second reinforcement rib 8 so that the strength of the second reinforcement rib 8 itself can be enhanced, thereby reducing the deformation of the substrate 1. Preferably, the second surface 102 of the substrate 1 may also be provided with a second frame 10, the second reinforcement ribs 8 are disposed in the second frame 10, and ends of the second reinforcement ribs 8 are connected to the second frame 10, further enhancing the strength of the second reinforcement ribs 8. Of course, the shape of the second encircled area formed by the intersecting second reinforcement ribs 8 may be another polygon such as a rectangle or a hexagon.

Specifically, the first heat sink assembly 2, the second heat sink assembly 11, the first reinforcement rib 3 and the second reinforcement rib 8 are made of metal It can be understood that the metal has higher heat conduction efficiency and thus the first heat sink assembly 2 and the second heat sink assembly 11 that are made of the metal have a higher heat dissipation effect; the metal has higher hardness, and thus the first reinforcement rib 3 and the second reinforcement rib 8 that are made of metal are not easy to deform. In this manner, the deformation of the light board during the hot working process can be reduced, facilitating increasing the size of the light board. In the present embodiment, the first heat sink assembly 2, the second heat sink assembly 11, the first reinforcement rib 3 and the second reinforcement rib 8 may all be made of copper.

Figure 2:
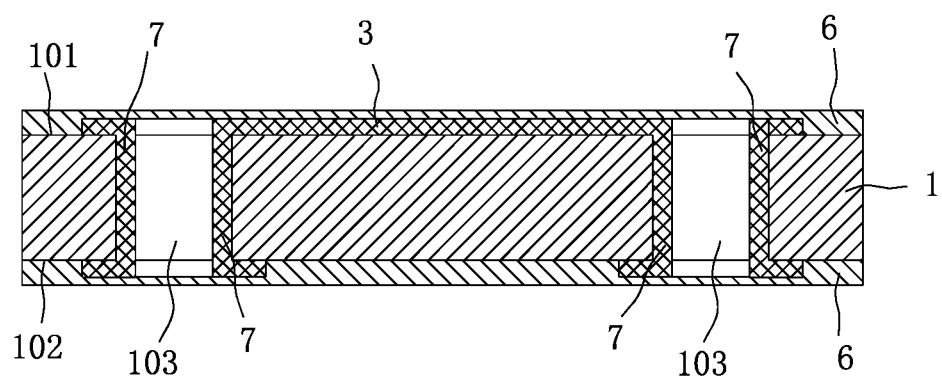
FIG. 2 is a sectional view of a light board according to an embodiment of the present disclosure.

Referring to FIG. 2, specifically, the non-wiring area of the substrate 1 is provided with multiple through holes 103, and a hole wall of each through hole 103 is provided with a first metal layer 7. In the present embodiment, the first metal layer 7 is a copper layer and may be formed on the hole wall of the through hole 103 by electroplating.

Referring to FIG. 2, in an embodiment, first metal layers 7 of any two through holes 103 are connected to only a first reinforcement rib 3 located between the any two through holes 103 so as to form a semi-closed loop. Referring to FIG. 3, in another embodiment, first ends of first metal layers 7 of any two through holes 103 are connected to a first reinforcement rib 3 located between the any two through holes 103 and the second ends of the first metal layers 7 of the any two through holes 103 are connected to only a second reinforcement rib 8 located between the any two through holes 103 so as to form a closed loop. In another embodiment, first metal layers 7 of any two through holes 103 are connected to only a second reinforcement rib 8 located between the any two through holes 103 so as to form a semi-closed loop. The first metal layer 7 can be used as an extension structure of the first reinforcement rib 3 and second reinforcement rib 8 so that the structure stability of the first reinforcement rib 3 and second reinforcement rib 8 of the substrate 1 can be increased, and the deformation of the first reinforcement rib 3 and second reinforcement rib 8 can be reduced, thereby improving the reinforcement effect of the first reinforcement rib 3 and second reinforcement rib 8 on the substrate 1, reducing the warpage deformation of the substrate 1 during the hot working process, and facilitating increasing the size of the light board. The light board in the present embodiment may include the preceding three embodiments at the same time, that is, the closed loop and two types of semi-closed loops are all included. The light board in the present embodiment may also include a combination of any two of the preceding three embodiments, that is, a combination of any two of the closed loop and two types of semi-closed loops is included. The light board in the present embodiment may also include only one embodiment, that is, only one of the closed loop and two types of semi-closed loops is configured.

In the present embodiment, a circuit structure 5 is disposed in each of the wiring areas 1010 of the first surface 101 and the second surface 102 of the substrate 1. The circuit structure 5 may be electrically connected to the LED device 502. The first reinforcement ribs 3, the first heat sink assembly 2, the second heat sink assembly 11 and the second reinforcement ribs 8 are required to be insulated from the circuit structure 5. The first reinforcement ribs 3, the first heat sink assembly 2, the second heat sink assembly 11 and the second reinforcement ribs 8 may be provided with an avoidance structure to avoid the circuit structure 5 on the substrate 1, avoiding the short circuit caused by contact of the first reinforcement ribs 3, the first heat sink assembly 2, the second heat sink assembly 11 and the second reinforcement ribs 8 with the circuit structure 5. Thus, shapes of the first reinforcement ribs 3, the first heat sink assembly 2, the second heat sink assembly 11 and the second reinforcement ribs 8 may be irregular.

In an embodiment, each of the first surface 101 and the second surface 102 of the substrate 1 is provided with an insulating layer 6. The insulating layer 6 can avoid the first reinforcement ribs 3, the first heat sink assembly 2, the second heat sink assembly 11 and the second reinforcement ribs 8 from being loosened and shifted to mistakenly contact the circuit structure 5, thereby reducing the probability of short circuit of the light board. The insulating layer 6 can also play a role of encapsulation and isolation so that the first reinforcement ribs 3, the first heat sink assembly 2, the second heat sink assembly 11 and the second reinforcement ribs 8 can be encapsulated on the substrate 1, avoiding the leakage of the light board. In the present embodiment, referring to FIG. 6, the circuit structure 5 of the substrate 1 is provided with a pad 501 for connecting the circuit structure 5 to an electronic device or an external circuit. For example, the pad 501 may be configured to connect the LED device 502. Since the pad 501 is required to be connected to the electronic device, the pad 501 needs to be exposed to the outside. That is, a position of the insulating layer 6 corresponding to the pad 501 needs to be hollowed out, and the insulating layer 6 cannot cover the pad 501.

In the present embodiment, a size of each mesh of the first heat sink assembly is 0.2 mm to 0.6 mm. In the present embodiment, a side surface of the first heat sink assembly 2 farther from the substrate 1 and the hole walls of the meshes of the first heat sink assembly 2 can all be the heat dissipation surface of the first heat sink assembly 2. It can be understood that the size of the mesh of the first heat sink assembly 2 directly affects the area of the heat dissipation surface of the first heat sink assembly 2. The size of the mesh of the first heat sink assembly 2 is limited so that the area of the heat dissipation surface of the first heat sink assembly 2 can be increased, thereby improving the heat dissipation effect on the substrate 1, reducing the thermal stress on the substrate 1 and reducing the deformation of the substrate 1. Of course, a size of each mesh of the second heat sink assembly 11 may be configured to be 0.2 mm to 0.6 mm, and the size of the mesh of the first heat sink assembly 2 may be the same as or different from the size of the mesh of the second heat sink assembly 11.

Referring to FIG. 1, it can be understood that a corner area of the substrate 1 is an area where the warpage deformation is most likely to occur. Therefore, the first reinforcement ribs 3 are required to cover the corner areas of the substrate 1, achieving the reinforcement effect on the substrate 1. Of course, the second reinforcement ribs 8 are also required to cover the corner areas of the substrate 1, further improving the reinforcement effect on the substrate 1 so as to reduce the deformation of the substrate 1.

Figure 7:
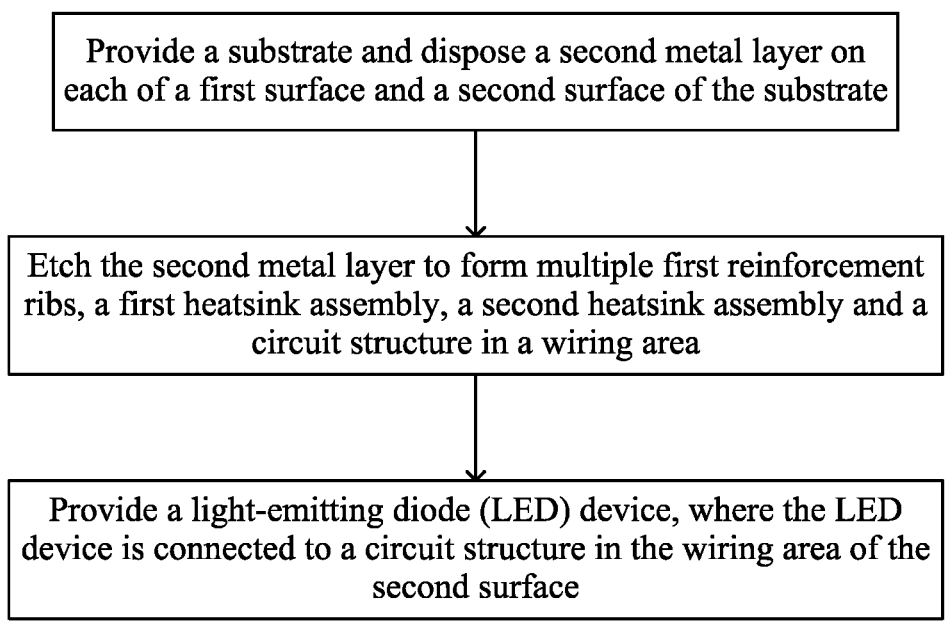
FIG. 7 is a flowchart of steps of a method for manufacturing a light board according to an embodiment of the present disclosure.

Referring to FIG. 7, the present embodiment further includes a method for manufacturing a light board, which is applied to manufacture the light board in the preceding embodiment. The method specifically includes the steps below.

In step S10, a substrate 1 is provided and a second metal layer is disposed on each of a first surface 101 and a second surface 102 of the substrate 1.

In step S20, the second metal layer is etched to form first reinforcement ribs 3, a first heat sink assembly 2, a second heat sink assembly 11 and a circuit structure 5 in a wiring area 1010.

In step S30, a light-emitting diode (LED) device 502 is provided to be connected to a circuit structure 5 in the wiring area 1010 of the second surface 102.

In the present embodiment, the second metal layer is a copper layer. When the second metal layer is etched, the first reinforcement ribs 3, the first heat sink assembly 2, and the circuit structure 5 can be formed on the first surface 101 at the same time, thereby simplifying the processing steps of the light board and improving the manufacturing efficiency of the light board.

In an embodiment, second reinforcement ribs 8 are disposed on the second surface 102 of the substrate 1. In this case, the step S20 further includes the step below. The second metal layer on the second surface 102 is etched to form the second reinforcement ribs 8 on the second surface 102.

Further, when through holes 203 are required to be disposed on the substrate 1, before the step S20, the method further includes the step below.

In step S101: through holes 103 are formed on the substrate 1, and a hole wall of each through hole 103 is provided with a first metal layer 7 to enable the first metal layer 7 to be connected to the second metal layer on at least one of the first surface 101 or the second surface 102 so as to form a semi-closed loop or a closed loop. In the present embodiment, before the second metal layer is etched, through holes 103 may be first formed on the substrate 1, then a first metal layer 7 is disposed on the hole wall of each through hole 103; when a closed loop is required, the first metal layer 7 may be connected to the second metal layer on each of the first surface 101 and the second surface 102; when a semi-closed loop is required, the first metal layer 7 may be connected to the second metal layer on the first surface 101 or the second surface 102; and finally the second metal layer is etched to form the first reinforcement ribs 3 and the first heat sink assembly 2 on the first surface 101, and the second reinforcement ribs 8 and the second heat sink assembly 11 on the second surface 102.

In the present embodiment, the method of forming the through holes 103 on the substrate 1 includes punching and drilling, but is not limited thereto.

In the present embodiment, the first metal layer 7 is formed in the through hole 103 by electroplating, but is not limited thereto.

In the present embodiment, the second metal layer may be etched on the substrate 1 by an etchant to form the circuit structure 5, the first reinforcement ribs 3, the second reinforcement ribs 8, the first heat sink assembly 2 and the second heat sink assembly 11.

The embodiment further provides a light-emitting diode (LED) backlight module. The LED backlight module includes the light board in the preceding embodiment. Since the light board in the preceding embodiment has a flat surface, the LED backlight module manufactured by using the light board in the preceding embodiment has a good display effect. Since the light board in the preceding embodiment has a relatively large size, the LED backlight module manufactured by using the light board in the preceding embodiment has a relatively large size.

The present embodiment further provides a light-emitting diode (LED) backlight device. The LED backlight device includes the LED backlight module in the preceding embodiment. Since the LED backlight module in the preceding embodiment has a good display effect, the LED backlight device manufactured by using the LED backlight module in the preceding embodiment has a good image quality. Since the LED backlight module in the preceding embodiment has a relatively large size, the LED backlight device in the present embodiment requires a small number of LED backlight modules, thereby reducing the production cost of the LED backlight device.

In the description of the present disclosure, it is to be understood that the orientation or position relationships indicated by terms "above", "below", "left", "right" and the like are based on the orientation or position relationships shown in the drawings, merely for facilitating description and simplifying operation, and these relationships do not indicate or imply that the referred device or element has a specific orientation and is constructed and operated in a specific orientation, and thus it is not to be construed as limiting the present disclosure. In addition, the terms "first" and "second" are used only to distinguish between descriptions and have no special meaning.

In the description of the specification, the description of reference terms "an embodiment" or "example" means that specific characteristics, structures, materials, or features described in connection with the embodiment or example are included in at least one embodiment or example of the present disclosure. In this specification, the illustrative description of the preceding terms does not necessarily refer to the same embodiment or example.

Moreover, it is to be understood that although this specification is described in terms of the embodiments, not each embodiment includes only one independent technical solution. Such description mode of the specification is merely for the sake of clarity, and those skilled in the art should regard the specification as a whole. The technical solutions in the embodiments may also be appropriately combined to form other embodiments which will be understood by those skilled in the art.

The technical principle of the present disclosure is described above in conjunction with the embodiments. The description is merely used for explaining the principle of the present disclosure, and is not intended to explain as limitations to the protection scope of present disclosure in any manners. Based on the explanations herein, other embodiments of the present disclosure thought of by those skilled in the art are within the scope of the present disclosure on the premise that no creative work is done.

What is claimed is:

1. A light board, comprising:
a substrate comprising a first surface and a second surface disposed opposite to each other, wherein the first surface and the second surface are each provided with a wiring area and a non-wiring area: a first heat sink assembly and a plurality of first reinforcement ribs are disposed in the non-wiring area of the first surface: the plurality of first reinforcement ribs intersect to form a first encircled area; and the first heat sink assembly is disposed in the first encircled area; and
a light-emitting diode (LED) device disposed in the wiring area of the second surface;
wherein a first reinforcement assembly is disposed at an intersection of at least two intersecting first reinforcement ribs of the plurality of first reinforcement ribs, and the first reinforcement assembly covers the intersection.

2. The light board of claim 1, wherein each of the first surface and the second surface is provided an insulating layer.

3. The light board of claim 1, wherein the first heat sink assembly has a mesh structure.

4. The light board of claim 1, wherein a second heat sink assembly is disposed in the non-wiring area of the second surface.

5. The light board of claim 4, wherein a plurality of second reinforcement ribs are disposed in the non-wiring area of the second surface: the plurality of second reinforcement ribs intersect to form a second encircled area; and the second heat sink assembly is disposed in the second encircled area.

6. The light board of claim 5, wherein the substrate comprises a plurality of through holes in the non-wiring area, and a hole wall of each of the plurality of through holes is provided with a first metal layer.

7. The light board of claim 6, wherein the plurality of first reinforcement ribs, the plurality of second reinforcement ribs, the first heat sink assembly and the second heat sink assembly are each made of metal, and first metal layers of any two of the plurality of through holes are connected to a first reinforcement rib or a second reinforcement rib between the any two of the plurality of through holes so as to form a semi-closed loop.

8. The light board of claim 6, wherein the plurality of first reinforcement ribs, the plurality of second reinforcement ribs, the first heat sink assembly and the second heat sink assembly are each made of metal, and first metal layers of any two of the plurality of through holes are connected to a first reinforcement rib and a second reinforcement rib between the any two of the plurality of through holes so as to form a closed loop.

9. A method for manufacturing a light board, wherein the light board comprises a substrate comprising a first surface and a second surface disposed opposite to each other, wherein the first surface and the second surface are each provided with a wiring area and a non-wiring area; a first heat sink assembly and a plurality of first reinforcement ribs are disposed in the non-wiring area of the first surface; the plurality of first reinforcement ribs intersect to form a first encircled area; and the first heat sink assembly is disposed in the first encircled area, and a light-emitting diode (LED) device disposed in the wiring area of the second surface, wherein a first reinforcement assembly is disposed at an intersection of at least two intersecting first reinforcement ribs of the plurality of first reinforcement ribs; and the first reinforcement assembly covers the intersection; the method comprising following steps:
S10: providing the substrate and disposing a second metal layer on each of the first surface and the second surface of the substrate;
S20: etching the second metal layer to form the plurality of first reinforcement ribs, the first heat sink assembly, the second heat sink assembly and a circuit structure in a wiring area; and
S30: providing the light-emitting diode (LED) device, wherein the LED device is connected to a circuit structure in the wiring area of the second surface;
the method further comprises a step of disposing a first reinforcement assembly at an intersection of at least two intersecting first reinforcement ribs of the plurality of first reinforcement ribs; and covering the intersection with the first reinforcement assembly.

10. The method of claim 9, wherein the step S20 further comprises:
etching the second metal layer on the second surface to form the plurality of second reinforcement ribs on the second surface.

11. The method of claim 10, before the step S20, further comprising:
S101: forming a plurality of through holes on the substrate and disposing a first metal layer on a hole wall of each of the plurality of through holes to enable the first metal layer to be connected to a second metal layer on at least one of the first surface or the second surface so as to form a semi-closed loop or a closed loop.

12. The method for manufacturing the light board of claim 9, further comprising a step of providing a mesh structure for the first heat sink assembly.

13. The method for manufacturing the light board of claim 9, further comprising a step of disposing a second heat sink assembly in the non-wiring area of the second surface.

14. The method for manufacturing the light board of claim 13, further comprising: a step of disposing a plurality of second reinforcement ribs in the non-wiring area of the second surface, wherein the plurality of second reinforcement ribs intersect to form a second encircled area; and a step of disposing the second heat sink assembly in the second encircled area.

15. The method for manufacturing the light board of claim 14, further comprising a step of providing the substrate with a plurality of through holes in the non-wiring area, and a step of providing a first metal layer for a hole wall of each of the plurality of through holes.

16. A light board, comprising:
a substrate comprising a first surface and a second surface disposed opposite to each other, wherein the first surface and the second surface are each provided with a wiring area and a non-wiring area: a first heat sink assembly and a plurality of first reinforcement ribs are disposed in the non-wiring area of the first surface: the plurality of first reinforcement ribs intersect to form a first encircled area; and the first heat sink assembly is disposed in the first encircled area; and
a light-emitting diode (LED) device disposed in the wiring area of the second surface;
wherein a second heat sink assembly is disposed in the non-wiring area of the second surface;
wherein a plurality of second reinforcement ribs are disposed in the non-wiring area of the second surface; the plurality of second reinforcement ribs intersect to form a second encircled area; and the second heat sink assembly is disposed in the second encircled area.

* * * * *